United States Patent [19]

Olmstead

[11] 3,936,863

[45] Feb. 3, 1976

[54] INTEGRATED POWER TRANSISTOR WITH BALLASTING RESISTANCE AND BREAKDOWN PROTECTION

[75] Inventor: John Aaron Olmstead, Somerville, N.J.

[73] Assignee: RCA Corporation, New York, N.Y.

[22] Filed: Sept. 9, 1974

[21] Appl. No.: 504,362

[52] U.S. Cl. ............... 357/51; 357/13; 357/36; 357/40; 307/318
[51] Int. Cl.² ............... H01L 27/02; H01L 29/90; H01L 29/72; H03K 3/26
[58] Field of Search ............ 357/13, 36, 40, 51, 56; 307/202, 285, 297, 318

[56] References Cited
UNITED STATES PATENTS

| | | |
|---|---|---|
| 3,435,295 | 3/1969 | Ladd et al............................... 357/40 |
| 3,510,771 | 5/1970 | Embree et al. ....................... 307/318 |
| 3,577,062 | 5/1971 | Hoffman et al...................... 307/285 |
| 3,609,460 | 9/1971 | Ollendorf et al...................... 357/36 |
| 3,619,741 | 11/1971 | Morgan................................ 357/51 |
| 3,740,621 | 6/1973 | Carley................................... 357/36 |

Primary Examiner—Martin H. Edlow
Assistant Examiner—Gene M. Munson
Attorney, Agent, or Firm—H. Christoffersen; R. P. Williams; R. A. Hays

[57] ABSTRACT

An integrated power transistor has at least one emitter region, having a ballasting resistance to reduce the possibility of second breakdown. Also integrated within the device is a voltage control diode, located between the collector terminal and the emitter terminal, to protect against high voltages caused by transient surges, particularly during switching times.

8 Claims, 4 Drawing Figures

INTEGRATED POWER TRANSISTOR WITH BALLASTING RESISTANCE AND BREAKDOWN PROTECTION

This invention relates to power transistors protected against second breakdown and high reverse bias voltages.

Transistors designed to handle relatively large amounts of power have been limited in their operating characteristics by second breakdown phenomena and by high voltage impressed on them during transient surges.

Second breakdown is the condition where the emitter current concentrates in localized regions of the emitter causing overheating which may seriously damage or completely destroy the device. The most common manner of compensating for this phenomenon is to introduce emitter ballasting resistors which distribute the emitter current more evenly throughout the emitter region and thus reduces the possibility of large current concentrations which may damage the device. This phenomenon and the described solution are discussed in U.S. Pat. No. 3,740,621 issued to Carley and assigned to the assignee named herein. Although this second breakdown solution is effective, it does not solve, nor does it attempt to solve, the operating characteristic limitation created by high voltages being impressed on transistors during transient surges.

It is well known that transistors can be easily destroyed by applying an excessive reverse bias voltage across the emitter and collector. In power devices this is most likely to occur during the switching transient time when the device is connected to an inductive load. That is, when the current flowing between the collector and emitter goes to zero, the energy stored in the inductive load creates very large voltages across the collector and emitter. Conventional transient surge protection consists of connecting a voltage control diode from the collector to emitter, the diode having a breakdown voltage rating lower than the breakdown voltage of the transistor. Conventional devices employing transient surge protection means, although effective, do not also solve the problem created by the second breakdown phenomena, unless of course the protective means is connected externally to a resistor ballasted device.

Figure 1:
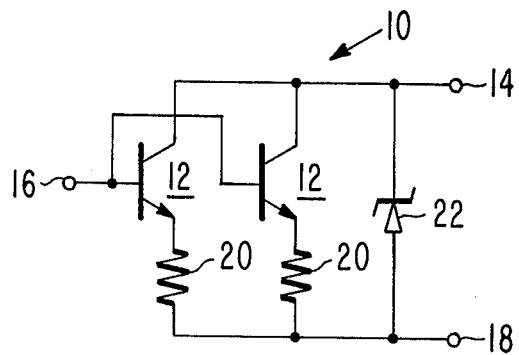
FIG. 1 is a schematic representation of the present device.

The present novel device, the equivalent circuit of which is indicated generally at 10 in FIG. 1 comprises at least one transistor element 12 which has a collector region, a base region, and at least one emitter region, shown in FIG. 1 as two transistors with their bases and collectors common. The device has first, second and third terminal means, 14, 16, and 18 respectively. The first, second, and third terminal means, 14, 16, and 18 may be designated as collector, base, and emitter terminal means, respectively.

Resistors 20 are in the electrical path between each emitter region and the emitter terminal means 18. A voltage control diode 22 is located across the electrical path from the collector terminal means 14 and the emitter terminal means 18.

The following examples describe only particular embodiments of the present device 10 and are not intended as the only embodiments possible. In the following description, for brevity and clarity, like numerals will be used to designate like features in each of the drawings.

Figure 2:
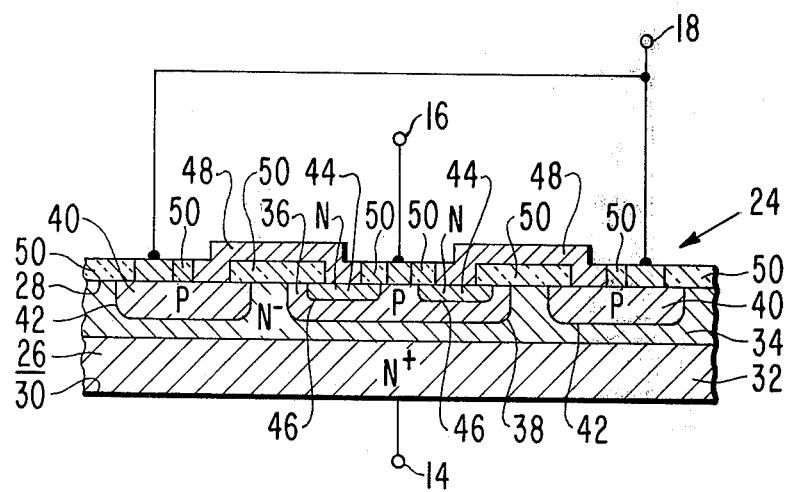
FIG. 2 is a partial cross-sectional view of one embodiment of the present device, now drawn to scale.

The present novel device in one of its embodiments is indicated generally at 24 in FIG. 2. The device 24 comprises a body of semiconductor material 26, preferably, but not necessarily, silicon, having one type conductivity, N type for example, and having at least first and second surfaces, 28 and 30 respectively. The body of semiconductor material 26 may contain a lower portion 32 and an upper portion 34. The lower portion 32 may have a higher carrier concentration than the upper portion 34. It will be understood by those familiar with the semiconductor art that the body of semiconductor material 26 may be P type so long as all other conductivity types described herein are reversed.

A first region 36, having a second type conductivity, P type for example, is adjacent a surface, preferably the first surface 28, of the body of semiconductor material 26. A first PN junction 38 exists at the interface between the first region 36 and the body of semiconductor material 26 and terminates at the first surface 28 thereof. At least one second region 40, having a second type conductivity, is adjacent the first surface 28 and is spaced apart from the first region 36 by a portion of the body of semiconductor material 26. At least one second PN junction 42, at the interface between the second region 40 and the body of semiconductor material 26, terminates at the first surface 28 thereof. The second PN junction 42 constitutes the voltage control diode 22 shown in FIG. 1.

At least one third region 44, preferably equal in number to the number of second regions 40, having the one type conductivity, is adjacent the first surface 28, is within the first region 36, and is separated from the body of semiconductor material 26 thereby. At least one third PN junction 46, at the interface between the third region 44 and the first region 36, terminates at the first surface 28.

A plurality of jumper means 48, insulated from the first surface 28, provide electrical paths from said second region to said third region. It is preferred that each one of the jumper means is connected from a single said second region to a single said third region. The plurality of jumper means 48 may be deposited conductive material over a layer 50 of insulating material, or they may be metal wires bonded in place with air as the insulator.

The first terminal means 14 makes electrical contact to the body of semiconductor material 26, preferably, but not necessarily, at the second surface 30 thereof. The second terminal means 16 makes electrical contact to the first region 36 containing the third region 44. In the preferred embodiment, the second terminal means 16 is equidistant from each of the third regions 44 contained therein, so that the resistances from the second terminal means 16 to each third region 44 are substantially equal. The third terminal means 18 makes electrical contact to the second region 40 and is spaced apart from the plurality of jumper means 48. The material of the second regions 40 in the electrical path between the jumper means 48 and the third terminal means 18 constitutes the resistors 20 shown in FIG. 1.

The device 24 may be fabricated using known planar technology.

Starting with the body of semiconductor material 26, the first region 36 having a second type conductivity is introduced, as by diffusion or ion implantation techniques, adjacent the first surface 28 thereof. The lower region 32 of the body 26 may have charge carriers of one type conductivity introduced therein, by any method used in the semiconductor art, to increase its carrier concentration to a larger value than that of the upper portion 34. Preferably, the first region 36 is formed in such a manner that it has a sheet resistivity of between about 20 $\Omega$/sq. to about 200 $\Omega$/sq.

Next at least one second region 40 is introduced adjacent the first surface 28 of the body of semiconductor material 26 and spaced apart from the first region 36. The second PN junction 42 is thereby formed at the interface between the second region 40 and the body of semiconductor material 26. The methods of forming the second region 40 are similar to the methods used to form the first region 36. If desired the first region 36 and the second region 40 may, by using known masking and photolithographic techniques, be formed simultaneously. Preferably, the sheet resistivity of the second region 40 is no greater than about 250 $\Omega$/sq.

The second region has a non-negative thermal coefficient, at normal device operating temperatures which is a characteristic of the doping level. That is, as the temperature of the material increases the resistance does not decrease. The resistors 20, in FIG. 1, therefore have a non-negative thermal coefficient.

The third region 44, having the one type conductivity, is then formed within the first region 36. The third region 44 may be formed by diffusion or ion implantation techniques known in the semiconductor art.

The plurality of jumper means 48, which form an electrical path between individual members of the second region 40 and individual members of the third region 44, are insulatingly disposed over the first surface 28. The plurality of jumper means 34 may be wires bonded in place and using air as an insulating medium; or they may be formed, by evaporation, RF sputtering or other known metallization techniques, over a layer of insulating material 50, such as silicon dioxide or the like. The material used for the plurality of jumper means 48 may be gold, aluminum or any other material compatible with the method used to form them.

The first, the second, and the third terminal means, 14, 16, and 18 respectively, may be fabricated individually or at the same time or a combination thereof. For example, the first terminal means 14 may be formed initially and then the second terminal means 16 and the third terminal means 18 may be fabricated simultaneously. It will be recognized by those skilled in the art that the plurality of jumper means 48 may also be formed at this time. If, however, the first terminal means 14, the second terminal means 16, the third terminal means 18, and the plurality of jumper means 48, are fabricated individually then different material and methods may be employed for each. For example, as stated above, the plurality of jumper means 48 may be wires bonded in place, gold wires for example, whereas the second terminal means 16 may be a solder connection to the first region 36.

Figure 3:
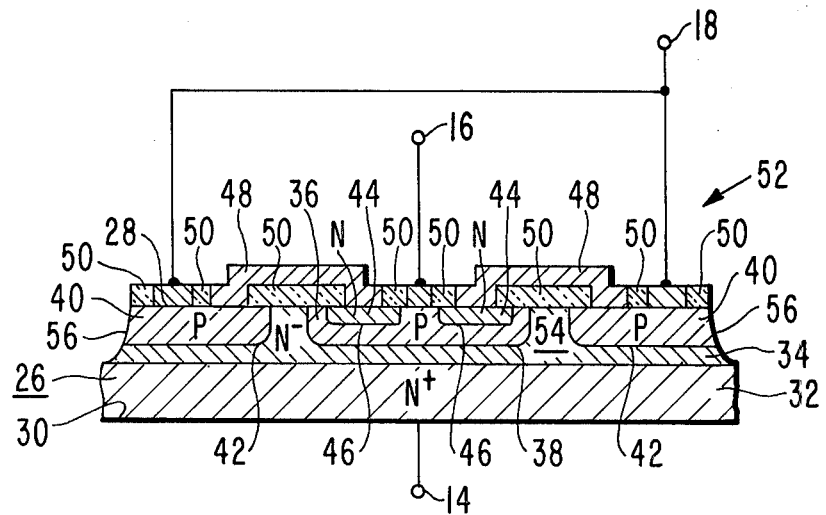
FIG. 3 is a partial cross-sectional view of a second embodiment of the present device, not drawn to scale.

A second embodiment of the present invention is shown in FIG. 3 as a device 52. In this embodiment a mesa 54 with sidewalls 56 has all the elements of the first embodiment, i.e., the device 24 shown in FIG. 2, contained therein. In this second embodiment, however, the second PN junctions 42 terminate at the sidewalls 56 of the mesa 54 as well as at the first surface 28 of the body of semiconductor material 26.

The device 52 may be fabricated using mesa techniques known in the semiconductor art.

Figure 4:
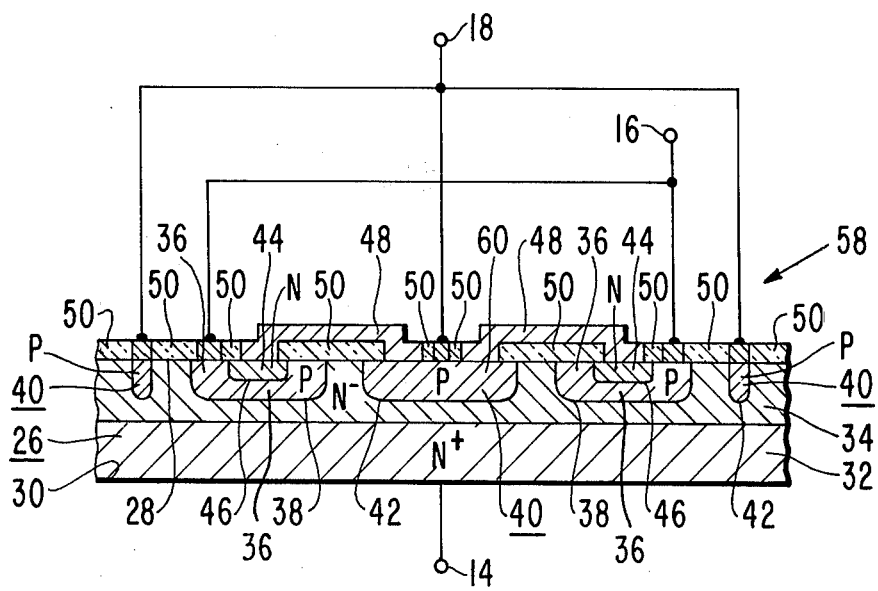
FIG. 4 is a partial cross-sectional view of a third embodiment of the present device, not drawn to scale.

A third embodiment of the present novel device 10 is shown in FIG. 4 as a device 58. In this embodiment there is a plurality of first regions 36 each one having at least one of the plurality of third regions 44 therein. The plurality of first regions 36 substantially surround at least one member 60 of a plurality of second regions 40. The plurality of jumper means 48 connect between each one of the plurality of third regions 44 and a single centralized member 60 of the plurality of second regions 26.

The device 58 may be fabricated using planar or mesas techniques which are well known in the semiconductor art.

In all of the described embodiments the body of semiconductor material 26 may be the collector, the first region 36 may be the base region, and the third regions 44 may be the emitter regions.

In the operation of the present invention the resistors 20 constituted by the regions 40, which, as described above, have non-negative thermal coefficients, are emitter ballast resistors. That is, if any member of the third regions 44, i.e., the emitter regions, begins to draw a significant amount of the total current flowing in the emitter regions, the corresponding second region 40 increases, or at least does not decrease, its resistive value; thereby distributing the current more evenly among the remainder of the third regions 44.

Preferably the breakdown voltage of the voltage control diode 22 should be less than the breakdown voltage of the first PN junction 38. This may be accomplished, for example, by forming the first region 36 and the second regions 40 separately and forming the second regions 40 shallower than the first region 36. The result is that the second regions 40 will be more susceptible to the known radius effect which will cause the second PN junctions 42 to have a lower breakdown voltage than the first PN junction 38.

An integrated power transistor which incorporates the present invention has a number of significant characteristics. For example, since the first region 36 and the second regions 40 may be formed in close proximity to each other, at high voltages the two different regions merge, due to the formation of depletion regions, and the radius effect which may have resulted in the voltage breakdown of the first PN junction 38 is eliminated.

When the second PN junctions 42 terminate at the sidewalls 56 of a mesa 54 the reverse bias leakage across the second PN junctions 42 may be reduced by passivating the sidewall 56, for example with a varnish, not shown in the drawings. Another characteristic of a mesa structure is that if the second PN junctions 42 terminate at the sidewalls 56 their breakdown voltage will be lower than the breakdown voltage of the first PN junction 38 because of known surface effects. This, as described above, is desireable for transient surge protection, for example.

The formation of the second region 40 separately from the formation of the first region 36 allows a wider range of ohmic values for the second regions 40 and hence a wider range of ballasting resistance valued for the device.

What is claimed is:

1. An integrated semiconductor device having resistor ballasting and having reverse bias breakdown protection comprising;
    a body of semiconductor material having one type conductivity and having at least a first and a second surface,
    at least one first region, having a second type conductivity, adjacent said first surface and forming an equal number of first PN junctions at the interface therebetween,
    at least one second region, having said second type conductivity, adjacent said first surface, and forming at least one second PN junction at the interface with said body of semiconductor material and being spaced apart from said first region thereby,
    at least one third region, having said one type conductivity, within said first region and separated from said body of semiconductor material thereby, said third region and said first region have a third PN junction at their interface,
    a plurality of jumper means, insulatingly disposed over said body of semiconductor material, providing electrical paths from said second region to said third region,
    first terminal means providing electrical contact to said body of semiconductor material,
    second terminal means providing electrical contact to said first region, and
    third terminal means providing electrical contact to said second region, said third terminal means being spaced apart from said plurality of jumper means.

2. An integrated semiconductor device having resistor ballasting and having reverse bias breakdown protection as claimed in claim 1 wherein;
    said body of semiconductor material contains a lower portion and an upper portion, said lower portion having a higher carrier concentration than said upper portion, said lower portion being adjacent said second surface and said upper portion being adjacent said first surface.

3. An integrated semiconductor device having resistor ballasting and having reverse bias breakdown protection as claimed in claim 1 wherein;
    each one of said jumper means is connected from a single said second region to a single said third region.

4. An integrated semiconductor device having resistor ballasting and having reverse bias breakdown protection as claimed in claim 1 wherein;
    said second region has a non-negative thermal coefficient.

5. An integrated semiconductor device having resistor ballasting and having reverse bias breakdown protection as claimed in claim 1 wherein;
    said resistor ballasting is located between said third region and said third terminal means whereby the ohmic value of said resistor ballasting is dependent on the sheet resistivity of said second region.

6. An integrated semiconductor device having resistor ballasting and having reverse bias breakdown protection as claimed in claim 1 wherein;
    said second PN junction constitutes a voltage control diode, said diode providing said reverse bias breakdown protection.

7. An integrated semiconductor device having resistor ballasting and having reverse bias breakdown protection as claimed in claim 6 wherein;
    said voltage control diode has a breakdown voltage less then the breakdown voltage of said first PN junction.

8. An integrated semiconductor device having resistor ballasting and having reverse bias breakdown protection as claimed in claim 1 wherein;
    said body of semiconductor material contains at least one mesa with sidewalls and each second PN junction terminates at said first surface and at said sidewalls of said mesa.

* * * * *